United States Patent [19]
Galbiati et al.

[11] Patent Number: 4,837,181
[45] Date of Patent: Jun. 6, 1989

[54] ROM MEMORY PROGRAMMING PROCEDURE USING MOS TECHNOLOGY WITH THIN GATE OXIDE AND JUNCTIONS

[75] Inventors: Sergio Galbiati, Treviglio; Alessandro Comi, Bernareggio, both of Italy

[73] Assignee: SGS-Thomson Microelectronics s.r.l., Agrate Brianza, Italy

[21] Appl. No.: 198,877

[22] Filed: May 27, 1988

[30] Foreign Application Priority Data

Jun. 11, 1987 [IT]  Italy ............................... 20872 A/87

[51] Int. Cl.[4] ................. H01L 21/308; H01L 21/316; G11C 17/00
[52] U.S. Cl. ........................ 437/45; 437/48; 437/52; 357/23.12; 365/104; 365/182
[58] Field of Search .............. 437/45, 48, 52, 239; 357/23.3, 23.9, 23.12; 365/104, 182, 184

[56] References Cited
U.S. PATENT DOCUMENTS

| | | | |
|---|---|---|---|
| 4,113,533 | 9/1978 | Okumura et al. | 357/23.9 |
| 4,356,042 | 10/1982 | Gedaly et al. | 357/23.12 |
| 4,364,165 | 12/1982 | Dickman et al. | 437/45 |
| 4,495,693 | 1/1985 | Iwahashi et al. | 437/52 |
| 4,513,494 | 4/1985 | Batra | 437/931 |
| 4,649,629 | 3/1987 | Miller et al. | 437/45 |

FOREIGN PATENT DOCUMENTS

| | | | |
|---|---|---|---|
| 54-47489 | 4/1979 | Japan | 437/45 |
| 54-143076 | 11/1979 | Japan | 357/23.9 |
| 57-10265 | 1/1982 | Japan | 357/23.9 |
| 58-170051 | 10/1983 | Japan | 437/48 |

Primary Examiner—Olik Chaudhuri
Attorney, Agent, or Firm—Gerald J. Ferguson, Jr.

[57] ABSTRACT

The cell to be programmed is subjected to wet isotropic etching to remove the oxide from above, beside and partially beneath the strip of polycrystalline silicon which forms the cell gate. There follows implantation of a dopant of a type opposite to that of the source junction and drain junction performed through the gate strip. Finally reoxidation of the entire cell area is performed.

2 Claims, 1 Drawing Sheet

ROM MEMORY PROGRAMMING PROCEDURE USING MOS TECHNOLOGY WITH THIN GATE OXIDE AND JUNCTIONS

DESCRIPTION

The present invention relates to a ROM memory programming procedure using MOS technology with thin gate oxide and junctions.

ROM memory programming performed at the same time as advanced processing stages has been in use for some time to reduce the customer's waiting time to a minimum.

By programming, i.e. 'personalizing', the product in the advanced phases of processing the time necessary to perform the processing up to that stage is subtracted from the customer's waiting time. To achieve this an all 'zero' or all 'one' ROM is used and written by selective ionic implantation performed through the polycrystalline silicon gate, to raise the threshhold voltage above the maximum supply voltage of the device. The cells implanted in this manner remain discriminated from those not implanted, forming the desired 'one' and 'zero' matrix.

However the present tendency toward ever greater drain integration creates problems in programming during advanced processing stages.

Indeed the transition from LSI to VLSI and ULSI involves, among other things, reduction in the thickness of the gate oxide and junctions.

As the threshhold voltage is proportional to the product of the charge implanted and the oxide thickness, this involves the necessity of implanting ever higher doses, which bring about, as concurrent phenomena, reduction of the breakdown voltage of the drain junctions or problems linked to other local electrical fields.

The object of the present invention is to accomplish a programming procedure for ROM memories with thin gate oxide and junctions which would permit raising of the trigger or threshhold voltage of the implanted cells even with relatively low implantation doses which in turn would permit keeping the breakdown voltage of the drain junction high.

In accordance with the invention said object is achieved by a programming procedure which, starting from a cell already formed with source and drain junctions made in a substrate between adjacent field oxide areas, a thin layer of gate oxide overlain on the substrate between said field oxide areas and said junctions, and a strip of polycrystalline silicon gate overlain on said gate oxide and incorporated in an oxide layer grown subsequently spanning the zone between said junctions, is characterized in that it comprises the phases (a) wet isotropic etching of the cell area for removal of the oxide above, beside and partially beneath said strip of polycrystalline silicon, (B) implantation of dope of a type opposite to that of the source and drain junctions through said strip of polycrystalline silicon in the zone of the substrate underlying said strip, and (c) reoxidation of the entire cell area.

It has been verified that in this manner it is possible to raise the conduction triggering, or threshhold, voltage to values higher than the supply voltage even with implantation doses which by themselves would be too low to permit it.

Limiting the implantation dose in this manner also makes it possible to secure breakdown voltages of the drain junctions, which are also higher than the supply voltage, thus securing both of the requirements.

In this manner it is possible to program during advanced stages of processing of ROM memories (or microprocessors containing ROMs) even if they are made using VLSI and ULSI field technologies.

BRIEF DESCRIPTION OF THE DRAWINGS

The procedure in accordance with the invention is illustrated for greater clarity as an example in the annexed drawings wherein.

DESCRIPTION OF THE INVENTION

Figure 1:
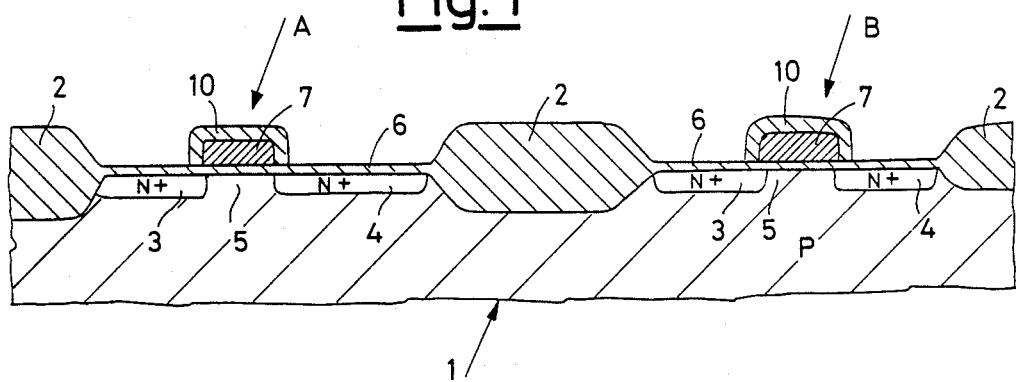
FIG. 1 shows a cross section of a pair of ROM memory cells before programming.
Figure 2:
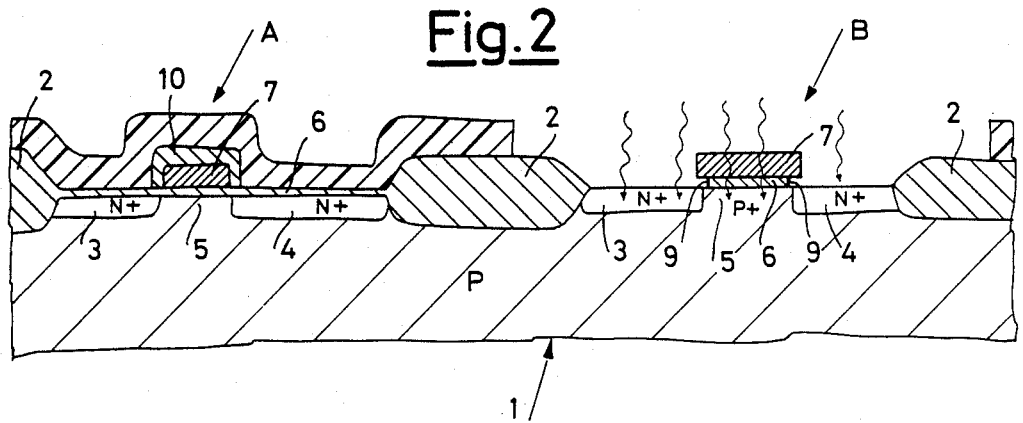
FIG. 2 shows said pair of cells during programming of one of them.

The programming procedure in accordance with the invention is performed starting with a processing stage such as that illustrated in FIG. 1 where each of two adjacent cells (or transistors), A and B, is shown formed on a common substrate 1 having low type P doping, field oxide areas 2 delimiting the cell area, a pair of junctions consisting of a source junction 3 and a drain junction 4 with N+ doping, an interposed channel area 5, an overlain thin layer of gate oxide 6, and a strip of gate polycrystalline silicon 7 incorporated in thermal oxide 10. Both cells A and B are at the same logic level. Now programming of the ROM, definition of the metal interconnecting contacts, the metal layer, and incorporation in the passivation are lacking. Desiring to program the memory in such a manner as to keep unaltered the state of cell A but modify the state of cell B, the procedure indicated in FIG. 2 is followed, i.e. after prior application of a resist mask 8 to the sides of the area of cell B, and in particular on the area of cell A, the area of cell B is subjected to wet isotropic etching to remove the gate oxide 6. As shown, the gate oxide is completely removed from above and from the sides of the polysilicon strip 7 and partially removed from underneath said strip in such a manner as to leave beneath the edges of the strip small bays 9 without oxide.

The area of cell B is subsequently subjected to boron implantation (type P dope) which, through the gate strip 7, reaches the channel area 5, implanting therein a P+ doping which raises the threshhold voltage of cell B. The dose of dope is however kept rather low to produce a junction breakdown voltage higher than the supply voltage.

Figure 3:
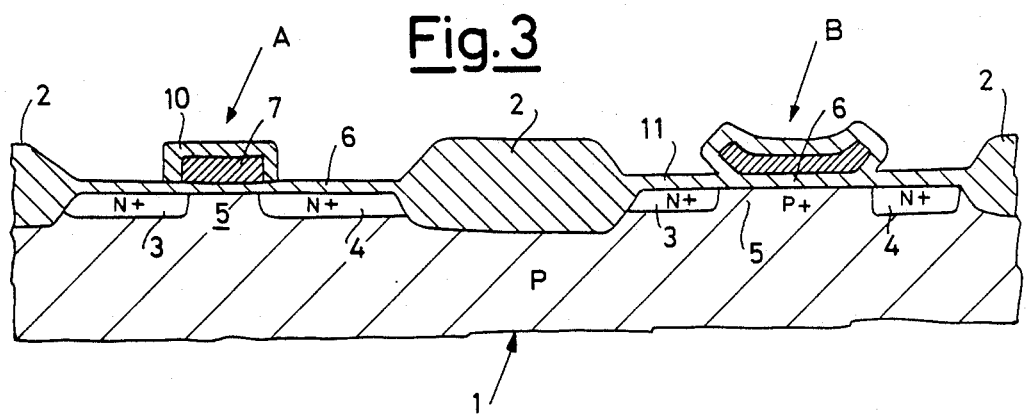
FIG. 3 shows said pair of cells at the end of the programming phase.

The entire memory is then subjected to reoxidation in a steam environment for regrowth of the gate oxide in the cell B area. An appropriate oxidation temperature (equal to or less than 800° C.) limits the growth of oxide on cell gate A, which is already oxidized, while cell B, previously cleaned, undergoes oxidation such as to raise the gate edges 7 and draw up said gate transversally as shown in FIG. 3. This takes place due to the effect of insertion of new oxide in the bay 9 under the gate strip 7 and gives as a result thicker oxide between the gate and the source and drain junctions and the loss of the vertical superimposition between said gate and said junctions. In other words, the gate is partially separated from the source and drain junctions, causing, with a low implantation dose and thin gate oxide, high threshhold voltage and also high breakdown voltage.

We claim:

1. ROM memory programming procedure using MOS technology with thin gate oxide and junctions in which the programming of a memory cell takes place starting with a cell already formed with source and drain junctions made in a substrate between adjacent field oxide areas, a thin layer of gate oxide overlain on the substrate between said field oxide areas, and a stirp of polycrystalline silicon gate overlain on said gate oxide and incorporated in an oxide layer subsequently grown spanning the zone between said junctions characterized in that it comprises the phases of wet isotropic etching of the cell area for removal of the oxide above, beside and partially underneath said strip of polycrystalline silicon, implantation of dopant of a type opposite to that of the source junction and drain junction through said strip of polycrystalline silicon, in the zone of the substrate underlying said strip, and reoxidation of the entire cell area.

2. Programming procedure in accordance with claim 1 characterized in that said reoxidation is performed in a steam environment at a temperature equal to or lower than 800° C.

* * * * *